(12) United States Patent
Nansei

(10) Patent No.: US 7,888,209 B2
(45) Date of Patent: Feb. 15, 2011

(54) NON-VOLATILE SONOS-TYPE MEMORY DEVICE

(75) Inventor: Hiroyuki Nansei, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/574,884

(22) Filed: Oct. 7, 2009

(65) Prior Publication Data

US 2010/0022081 A1 Jan. 28, 2010

Related U.S. Application Data

(60) Division of application No. 11/319,999, filed on Dec. 27, 2005, now Pat. No. 7,675,107, which is a continuation of application No. PCT/JP2004/019647, filed on Dec. 28, 2004.

(51) Int. Cl.
*H01L 29/792* (2006.01)
(52) U.S. Cl. ............... 438/264; 257/321; 257/E29.309; 365/185.28
(58) Field of Classification Search .................. 438/264; 257/321, E29.309; 365/185.28
See application file for complete search history.

(56) References Cited

U.S. PATENT DOCUMENTS

| | | | |
|---|---|---|---|
| 6,878,988 B1 * | 4/2005 | Lee et al. ..................... | 257/324 |
| 7,015,540 B2 * | 3/2006 | Ishii et al. ..................... | 257/322 |
| 2004/0084706 A1 * | 5/2004 | Osabe et al. .................. | 257/298 |
| 2004/0104425 A1 * | 6/2004 | Kobayashi et al. ........... | 257/321 |
| 2004/0262673 A1 * | 12/2004 | Hsiao et al. .................. | 257/324 |
| 2005/0158953 A1 * | 7/2005 | Deppe et al. ................. | 438/259 |

FOREIGN PATENT DOCUMENTS

DE 10226964 A1 * 1/2004

* cited by examiner

Primary Examiner—Steven J Fulk

(57) ABSTRACT

A semiconductor memory device with the thickness of both a tunnel film and a top film provided thereon configured to be in the FN tunneling region (4 nm or more). Data retention characteristics can be improved by configuring both a tunnel film and a top film to have a thickness in the FN tunneling region. Secondly, a high-concentration impurity region of a conductivity type the same as that of the substrate is provided in a substrate region arranged between assist gates provided adjacently to each other. The aforementioned high-concentration impurity region makes a depletion layer extremely thin when bias is applied to the assist gates. Hot holes generated between bands in the depletion region are injected into a charge storage region and the holes and electrons make pairs and disappear, enabling easy data erasing.

17 Claims, 16 Drawing Sheets

CHARGE

NON-VOLATILE SONOS-TYPE MEMORY DEVICE

CROSS-REFERENCES TO RELATED APPLICATIONS

This is a divisional of U.S. patent application Ser. No. 11/319,999, filed Dec. 27, 2005, which is a continuation of International Application No. PCT/JP2004/019647, filed Dec. 28, 2004, which was not published in English under PCT Article 21(2).

TECHNICAL FIELD

This invention generally relates to semiconductor devices, and more particularly, to a non-volatile SONOS-type memory technology, which enables excellent data retention characteristics and easy data erase.

BACKGROUND

Conventionally, flash memories with the use of the floating gate technique have been widely used as non-volatile flash memories to be incorporated into the electronics devices. However, there are limitations for flash memory designed with the floating gate technique if the memory cell is further downsized to realize high storage density in the flash memory and the manufacturing process rule becomes equal to or smaller than 90 nm. This is because the area of the high-voltage transistor-forming region, to be provided for programming and erasing data, inevitably becomes relatively wide in a small-sized memory of the floating gate type, resulting in a rise in the manufacturing costs, or it becomes difficult to reduce a cell portion without degrading the reliability due to the possibility of memory error or data loss.

On the other hand, non-volatile memory having a thin film storage region stores a memory bit by storing the charge between two insulation films (oxide films) provided below the gate made of polysilicon. The non-volatile memory of the aforementioned thin film storage system includes SONOS (Silicon Oxide Nitride Oxide Silicon) type non-volatile memory and nanocrystal memory, in which the charge is stored in a silicon nitride film (ONO: oxide film/nitride film/oxide film) sandwiched by the silicon oxide films. The above-mentioned thin film storage method is designed so that the trap (or nanocrystal) in the nitride film may retain the charge and the stored charge is prevented from moving to another storage region. Accordingly, the above-mentioned thin film storage method has characteristics that the charge loss is suppressed and the data retention characteristics are improved, although charge loss may occur in the floating gate method.

In the technical field of non-volatile memory, there is an NROM (nitride read-only memory) having two bits/cell, a memory cell structure in which a unit cell is designed to include multiple-bits (for example, see Japanese Patent Application Publication 2001-156275 (hereinafter, referred to as "Patent Document 1") and the cited documents therein).

FIG. 1 is a view illustrating the operation principle of NROM, and schematically shows a cross-sectional view of an NROM unit cell. The NROM cell includes first and second bit lines 12a and 12b, electrically separate from each other, which are formed by injecting an n-type dopant in regions close to the surface of a p– type conductive silicon substrate 10. A LOCOS 13 of a thin film is arranged thereon, and an ONO structure (oxide film/nitride film/oxide film) 14 is arranged on a surface region of the semiconductor substrate provided between the LOCOS 13. A word line (gate line) of polysilicon is formed so that the gate may be formed in the surface region of a semiconductor substrate 11 provided below the ONO structure 14 (below the LOCOS 13 of the thin film region). That is to say, the NROM memory cell transistor substantially has the same fundamental structure as that of a conventional n-channel MOS-FET except that an electron capture layer of the ONO structure is employed instead of a gate dielectric film.

During programming the cell of the above-mentioned NROM, for example, a given bias $V_G$ is applied to the gate line 15 and a positive bias $V_{B2}$ is applied to the second bit line 12b while the first bit line 12a is grounded. Then, a channel is formed between the first bit line 12a and the second bit line 12b and electrons flowing to the second bit line 12b from the first bit line 12a are captured and stored in one end region (a second bit) 16b in the ONO structure 14.

Additionally, if the bias conditions that are applied to the first bit line 12a and the second bit line 12b are reversed, the electrons flowing to the first bit line 12a from the second bit line 12b are captured and stored in the other end region (a first bit) 16a in the ONO structure 14.

In contrast, during reading the cell of the above-mentioned NROM, a given bias $V_G'$ is applied to the gate line 15 and a positive bias $V_{B1}'$ is applied to the bit line 12a while the second bit line 12b is grounded. In this manner, (the second bit) 16b can be read. Also, if the bias conditions that are applied to the first bit line 12a and the second bit line 12b are reversed, (the first bit) 16a can be read.

In addition, the width of the first bit 16a and that of the second bit 16b of the electron capture regions are designed to be sufficiently thinner than that of the channel formed between the two bit lines 12a and 12b. Hence, the two bits 16a and 16b do not affect each other, and each of the bits can be programmed and erased separately.

As described above, two pieces of bit information can be stored in the NROM by reversing the bias conditions to be applied to the first bit line 12a and the second bit line 12b. Assuming that the minimum process size is set to F, a miniaturization of $4F^2$ can be attained in each cell, enabling a highly integrated memory.

The minimum process size F is determined by the minimum process line width of the photolithography process, and there are the following difficulties in order to realize a cell having the area of $4F^2$.

When a virtual ground array structure is produced, a buried line is generally formed by the diffusion layer to be used for the source line or bit line according to the purpose thereof. However, the afore-mentioned diffusion layer is formed by ion-implantation. The implanted ions are bombarded onto the crystal lattice of the silicon substrate or diffused in the silicon crystal by thermal treatment done after the ion-implantation. This makes it difficult to downsize the width of the diffusion layer to the limit of the photolithography technique. Moreover, if a self-alignment process with the use of a hard mask is employed by providing a sidewall to overcome the afore-mentioned limitation in the photolithography technique, the device fabrication process will become complicated.

SUMMARY OF THE INVENTION

The present invention has been made to overcome the above drawbacks of the prior art and has an object of providing a technique for forming a non-volatile memory of the SONOS type that enables excellent data retention characteristics and easy data deletion.

According to an aspect of the present invention, preferably, there is provided a semiconductor device including a semiconductor substrate of a chosen conductivity type, a charge storage region including a tunnel oxide film and a storage film provided below a word line and provided above the semiconductor substrate, assist gates provided on a gate insulating film on the semiconductor substrate, and a high-concentration impurity region that is provided in the semiconductor substrate and is located between adjacent assist gates, the high-concentration impurity region having the same conductivity type as that of the semiconductor substrate.

On the above-mentioned semiconductor device, the high-concentration impurity region may extend to outer edges of the adjacent assist gates. The tunnel oxide film may have a thickness equal to or greater than any of 4 nm, 5 nm, 6 nm, 7 nm, and 10 nm. The charge storage region may include a top oxide film provided on the storage film, and at least one of the tunnel oxide film and the top oxide film has a thickness equal to or greater than any of 4 nm, 5 nm, 6 nm, 7 nm, and 10 nm. Preferably, the tunnel oxide film may have a thickness in which FN tunneling is dominant. The above-mentioned semiconductor device may further include sidewalls provided along sides of the assist gates. Preferably, the sidewalls are parts of the charge storage region provided along the sides of the assist gates. The charge storage region may be located below the assist gates. The tunnel oxide film may include a gate insulating film provided below the assist gates. The charge storage region may be provided so as to cover the assist gates. The above-mentioned semiconductor device may further include a substantially U-shaped recess provided in the semiconductor substrate located between adjacent assist gates.

According to another aspect of the present invention, preferably, there is provided a method of fabricating a semiconductor device comprising the steps of forming assist gates on a gate insulating film on a semiconductor substrate of a chosen conductivity type, forming a high-concentration impurity region in the semiconductor substrate located between adjacent assist gates, the high-concentration impurity region having the same conductivity type as that of the semiconductor substrate, and forming a charge storage region above the semiconductor substrate and composed of at least a tunnel oxide film and a storage film. The above-mentioned semiconductor device may further include a step of forming a substantially U-shaped recess provided in the semiconductor substrate and located between adjacent assist gates. The above-mentioned semiconductor fabrication method may further include a step of forming sidewalls along sides of the assist gates.

According to another aspect of the present invention, preferably, there is provided a semiconductor device including a semiconductor substrate, a charge storage region including a tunnel oxide film and a storage film provided below a word line and above the semiconductor substrate, assist gates provided on a gate insulating film on the semiconductor substrate, and a substantially U-shaped recess in the semiconductor substrate located between adjacent assist gates.

According to the present invention, firstly, both the thickness of a tunnel film and that of a top film provided thereon are configured to be an FN tunneling region (4 nm or more). It is therefore possible to provide a SONOS type non-volatile memory having high data retention characteristics. Secondly, a high-concentration impurity region of the same conductivity type as that of the substrate is provided in a substrate region arranged between assist gates adjacently provided to each other. This makes it possible to provide a SONOS type non-volatile memory that realizes easy data erase.

DETAILED DESCRIPTION

Figure 1:
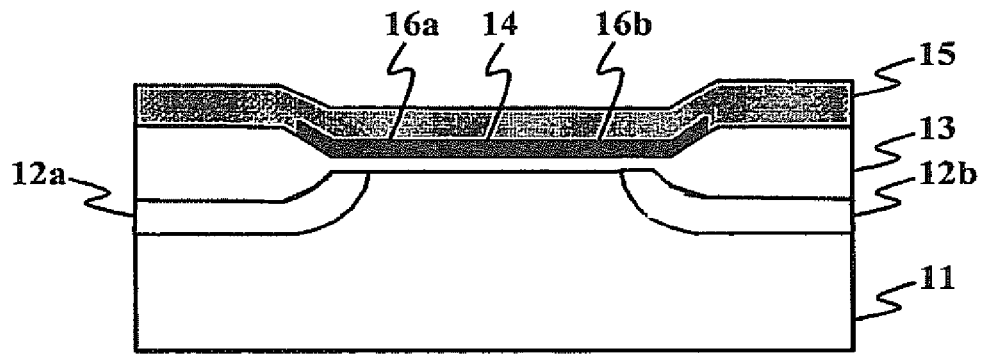
FIG. 1 schematically shows a cross-sectional view of a unit cell of a NROM to illustrate the operation principle thereof.

A description will now be given, with reference to the accompanying drawings, of embodiments of the present invention.

On a semiconductor memory device in accordance with the present invention, as will be described later in more detail, firstly, the storage film is sandwiched from top and bottom to form the ONO structure (a charge storage region) including a tunnel film and a top film. Both the thickness of the tunnel film and that of the top film are configured to be in the Fowler-Nordheim (FN) tunneling region (4 nm or more). The data retention characteristics can be enhanced by configuring both the thickness of the tunnel film and that of the top film to be in the FN tunneling region.

Secondly, assist gates are provided, and a high-concentration impurity region of the conductivity type of the substrate is located between assist gates adjacently arranged to each other, in a region close to the surface of the substrate. The aforementioned high-concentration impurity region extends up to lower regions of outer edges of the assist gates. By providing the high-concentration impurity region as described, a depletion layer, to be formed between an inversion layer and the high-concentration impurity region adjacently provided thereto, is made considerably thin when bias is applied to the assist gates. For this reason, in accordance with the present invention, the depletion layer can be made thin in an end region of the inversion layer (namely, the lower regions of outer edges of the assist gates), whereas, conventionally, the depletion region is uniformly formed in the periphery of the inversion region. Therefore, a high electric field is applied to the depletion region and hot holes are generated between bands. The hot holes are injected into the charge storage region in the storage film of the ONO structure and pairs of electrons and electron holes stored in this region disappear, providing easy data erase.

A description will be given of theoretical considerations that have lead to the present invention, before embodiments of the present invention are described. The diffusion layer is formed by ion-implantation which is used as the buried line (source line or bit line), yet it is difficult to downsize the width of the diffusion layer to the limit of the photolithography process because the implanted ions are bombarded onto the crystal lattice .or diffused due to the subsequent thermal treatment, as described above. The assist gate is provided on the electrode side to solve the above-mentioned drawback. The inversion layer, which is formed by applying bias to the assist gate, is used as a wiring layer. This does not have to change the process size of the assist gate and the inversion layer can be used as the "buried line", enabling downsizing the width of the diffusion layer to the limit of the photolithography process.

There is another structure example of a memory cell, "the third embodiment of the memory cell" of Patent Document 1 (hereinafter referred to as related art), which has been proposed on the basis of a conception similar to the above-mentioned consideration. However, this related art has the problem in the configuration thereof in the thickness of the oxide film in view of the data retention, as will be described hereafter.

In regards to this related art, the MOS inversion layer in the switch transistor is used as the wiring instead of the wiring of the diffusion layer in the memory cell. The hot electron is injected into the source side at the time of writing, and a current in the same direction is detected at the time of reading. This makes it possible to operate in the opposite direction in the memory cell, enabling two-bit operation in one memory cell. The tunnel oxide film formed in the memory transistor is configured to have a thickness of 5 nm (for the FN tunneling region), and the top oxide film provided thereabove is configured to have the thickness of 3 nm (in the direct tunneling region). The electron is extracted to the gate electrode side for erasing.

While Patent Document 1 does not explicitly describe reasons, the following reasons can be considered as to why the above-mentioned configuration has been employed. In the related art, the memory cell array is configured without the diffusion layer. If the electron is attempted to be extracted to the substrate side, it is necessary to extract the electron to the inversion layer. However, under the bias condition convenient to extract the electron (namely, negative gate electrode), the inversion layer does not extend from the lower portion of the assist gate. That is to say, the inversion layer does not reach the region in which the charge is stored (namely, the channel region). Hence, the electron cannot be extracted to the substrate side. Thus, the electron inevitably has to be extracted to the gate electrode side.

The top oxide film is needed to be thin, approximately 3 nm, to extract the electron in this manner for the following reasons. As is well known, the electron conduction mechanism in an oxide film having a thickness of approximately at most 10 nm is categorized into FN tunneling and direct tunneling. The actual electron conduction can be regarded as the sum of the aforementioned two conduction mechanisms.

In the two mechanisms, the FN tunneling effect is dominant when the oxide film has the thickness of at least 4 nm, and, in particular, is dominant when the thickness is 5 nm. The current size required for FN tunneling is dependent on the size of the electric field, and is not dependent on the thickness of the oxide film. In contrast, the direct tunneling effect is dominant when the thickness is less than 4 nm and, particularly, is dominant when the thickness is 3 nm or less. The current amount varies depending on the thickness of the oxide film, even if the strengths of the electric fields are the same.

The data to be erased by extracting the electron has choices whether the electron is extracted to the gate electrode side or to the substrate side. It is necessary to make the oxide film to which the electron is extracted thin enough to be equal to the thickness of the direct tunneling region, for whichever oxide film the electron is extracted to. This is because the conduction mechanism of the FN tunneling is dependent only on the strength of the electric field applied. Even if there is a difference in the thickness of the oxide film in the thickness range for FN tunneling region (the thickness range of 4 nm or more), the electrons are flowing from the opposite side at the same time as the electrons are extracted. This makes it difficult to erase completely. In the above-mentioned related art, erasing is performed by extracting the electrons to the gate electrode side. The top oxide film is designed to have a thickness of 3 nm, same as that of the direct tunneling region, which is thinner than that of the tunnel film (the FN tunneling region) of 5 nm.

However, if any of the top film and the tunnel film has a thickness equal to that of the oxide film in the direct tunneling region, there is the problem in that the data retention characteristics are inferior to a case where both the top film and the tunnel film employ an oxide film having a thickness in the FN tunneling region.

Therefore, in accordance with the present invention, the thickness of the tunnel film and that of the top film are configured to be in the FN tunneling region. Specifically, these thicknesses are configured to be equal to or greater than 4 nm. The data retention characteristics can be enhanced by configuring both the tunnel film and the top film to have the thicknesses within the FN tunneling region. It is preferable that these thicknesses should be configured to be equal to or greater than 4 nm; for example, equal to or greater than 5 nm. Preferably, they should be equal to or greater than 7 nm. More preferably, they should be equal to or greater than 10 nm. As the thickness of the film increases, the data retention characteristics can be improved.

In addition, erasing is difficult by only employing a thickness within the FN tunneling region for the thickness of the tunnel film and that of the top film. Further, if the tunnel film and the top film have the same thickness and even if the thickness is equal to that of the direct tunneling region, there will arise the problem that, in erasing, is difficult when both the tunnel film and the top film have thicknesses in the FN tunneling region because the dependency on the electric field provides equal conductivity for both of the films.

Accordingly, a high-concentration impurity region having the same conductivity type as that of the substrate is provided on the substrate region between the assist gates adjacently provided in accordance with the present invention. If the aforementioned high-concentration impurity region is provided, the depletion layer, to be formed between the inversion layer and the high-concentration impurity region adjacently arranged thereto, becomes extremely thin at the time of applying bias to the assist gates. This applies a high electric field to the depletion layer and the hot holes are generated between the bands. These hot holes are injected into the charge storage region having the ONO structure and form pairs with the electrons stored in this region, enabling easy data erasing. Here, as a bias at the time of erasing, for example, 0 V is applied to the substrate, 5 V is applied to the inversion layer, 8 V is applied to the assist gate, and −5 V is applied to the word line.

Hereinafter, a description will be given of embodiments of the present invention.

First Embodiment

In the present embodiment, there is provided an ONO structure in which a tunnel oxide film, a storage nitride film, and a top oxide film are sequentially laminated. This ONO structure is formed after the assist gate is formed, and there is not provided a sidewall on a side wall of the assist gate.

Figure 2:
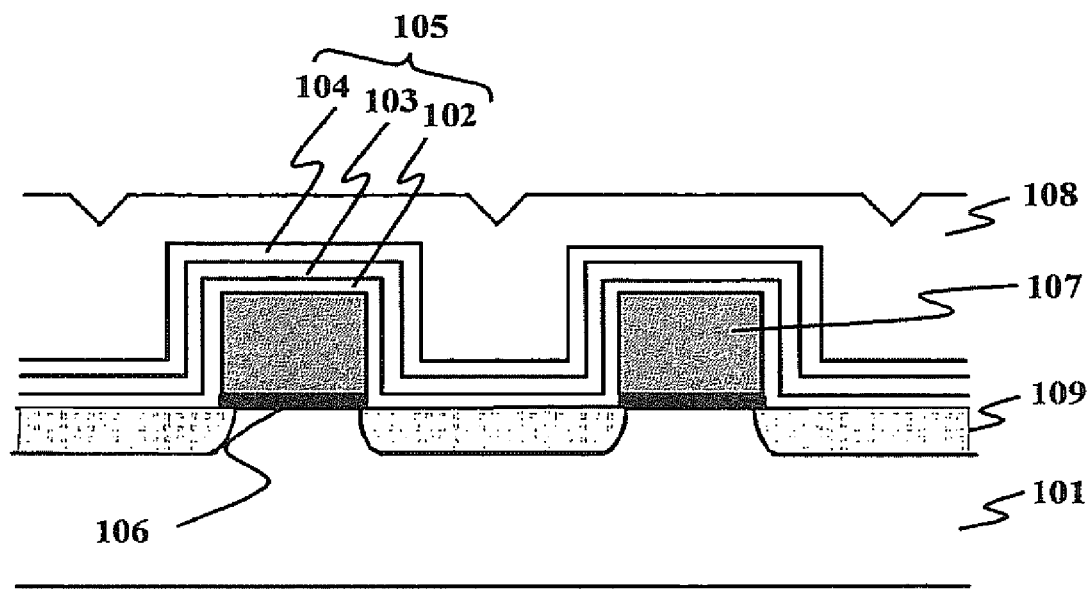
FIG. 2 is a cross-sectional view of a memory cell in accordance with a first embodiment of the present invention.

FIG. 2 is a view illustrating a cross-sectional view of the memory cell in accordance with a first embodiment of the present invention. In this figure, a reference numeral 101 represents a semiconductor substrate, a reference numeral 102 represents a tunnel oxide film, a reference numeral 103 represents a storage film of silicon nitride film, and a reference numeral 104 represents a top oxide film provided on the storage film 103. A laminated structure of the tunnel oxide film 102, the storage film 103, and the top oxide film 104 forms an ONO structure 105. As described above, both the tunnel film 102 and the top film 104 are configured to be oxide films having thicknesses at least 4 nm for operation in the FN tunneling region.

The ONO structure 105 is formed to cover an assist gate 107 and a gate insulating film 106, which is formed at given intervals on the surface of the semiconductor substrate 101. The assist gates 107 are arranged on the gate insulating films 106 at given intervals. A word line 108 is laminated on the whole surface of the ONO structure 105. A high-concentration impurity region 109 is provided between the assist gates 107 in a surface region of the semiconductor substrate 101. The impurity region 109 has a conductivity type the same as that of the semiconductor substrate 101. The semiconductor substrate 101 is a p-type silicon substrate, and accordingly, the high-concentration impurity region 109 is p+.

There are different points of the aforementioned configuration, as compared to that of the related art, in that the high-concentration impurity region 109 is provided between the assist gates 107 in the surface region of the semiconductor substrate 101 and both the tunnel film 102 and the top film 104 have thicknesses equal to or greater than 4 nm.

In the first embodiment, the data retention characteristics can be enhanced because of the above-described reasons and data can be erased easily. In addition, the gate insulating film 106 provided below the assist gate 107 can be made thinner than the ONO structure 105. The inversion layer serving as the wiring allows an improved operation margin.

Figure 3A:
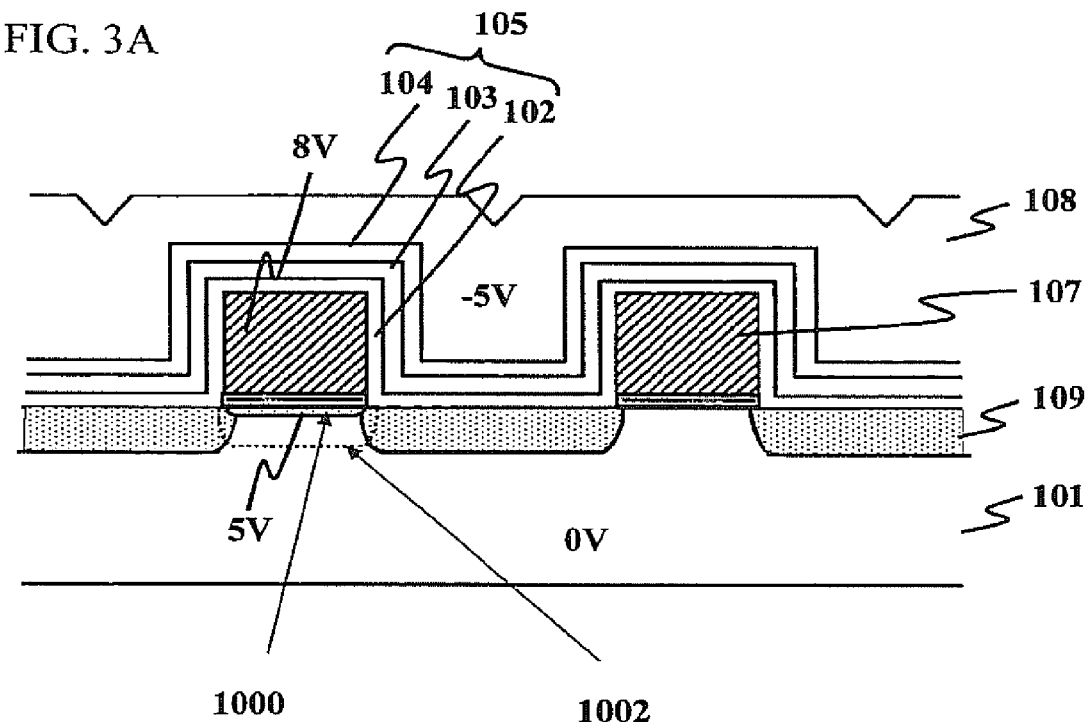
FIGS. 3A and 3B are views showing the principle of operation of the first embodiment.
Figure 3B:
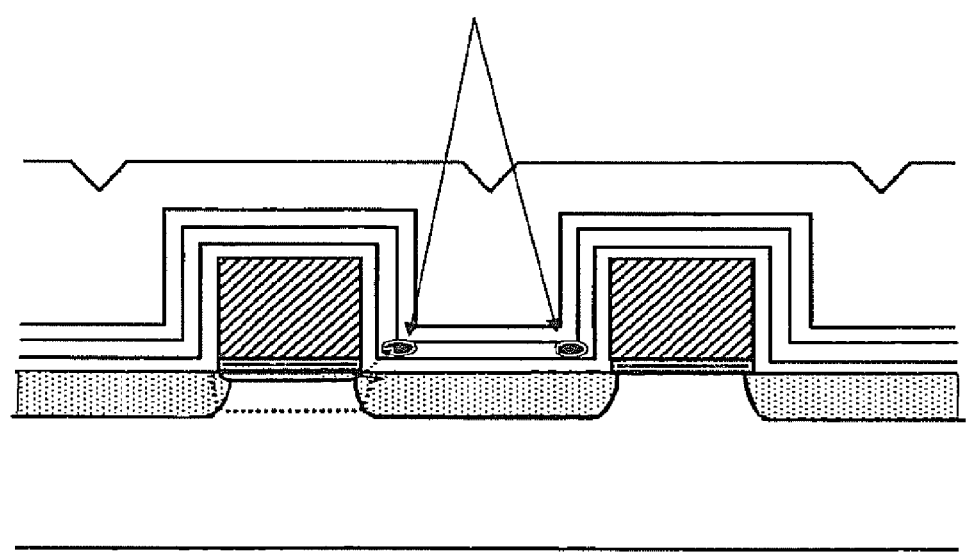

FIG. 3A illustrates an example of operation voltages during erase. The voltages shown are a case where the semiconductor substrate 101 is a p-type semiconductor substrate. If the semiconductor substrate 101 of an n-type is employed, the region 109 is n+, and the positive and negative in the operation voltages are inverted. An inversion layer 1000 is formed below the assist gate 107 and immediately below the gate insulating film 106. The inversion layer 1000 is extremely thin, and, while shown as thin as possible in the drawing, may actually be relatively thinner. A depletion region 1002 shown by a dotted line extends from the inversion layer 1000. FIG. 3B shows charges stored in the storage film 103. The tunneling effect between bands readily occurs in a thinnest portion of the depletion layer 1002. A tunneling current between bands is shown as a dotted arrow. Holes are accelerated to flow in the direction of the arrow and become hot holes to go over the potential barrier of the tunnel oxide film 102. The hot holes are pulled by the bias applied to the word line 108 and injected into the storage film 103. Erasing is performed by neutralizing the stored electrons. Reading and writing operations are similar to those described in Patent Document 1, so the description is omitted here.

Figure 4:
FIG. 4 is a view showing a (first) fabrication method for the first embodiment.
Figure 5:
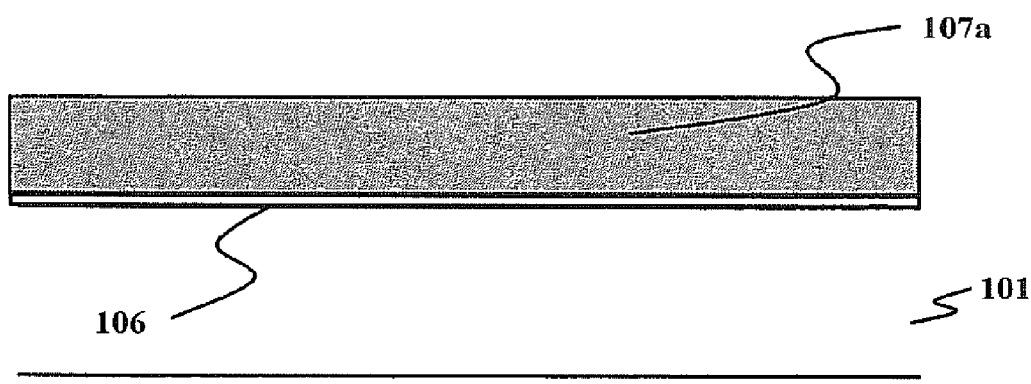
FIG. 5 is a view showing a (second) fabrication method for the first embodiment.
Figure 6:
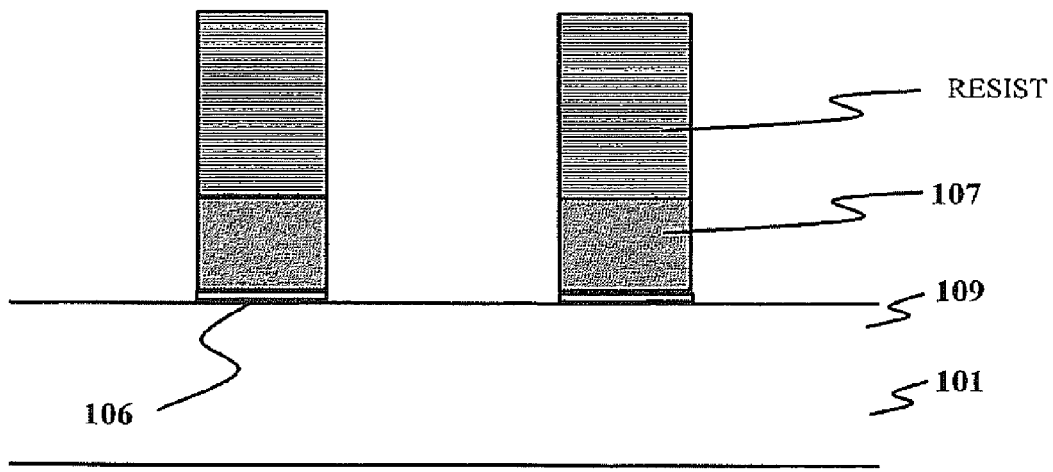
FIG. 6 is a view showing a (third) fabrication method for the first embodiment.
Figure 7:
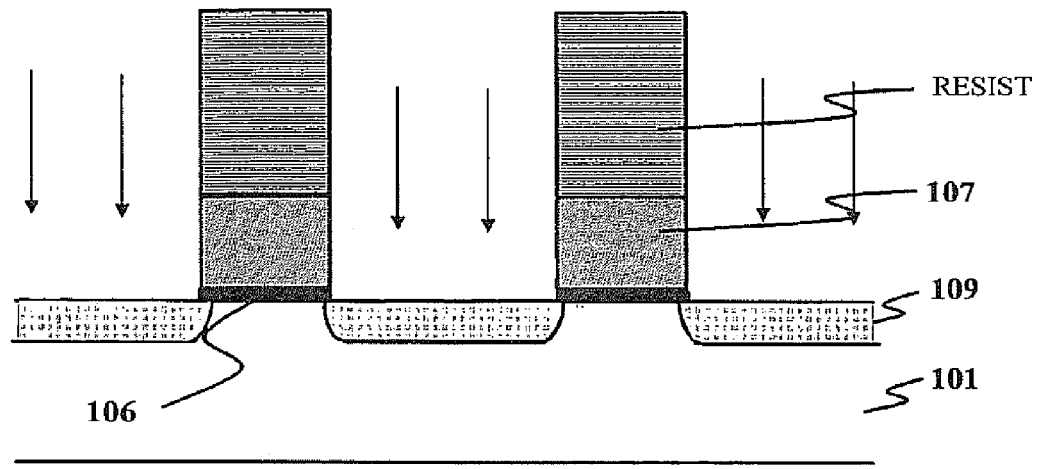
FIG. 7 is a view showing a (fourth) fabrication method for the first embodiment.

Next, a description will be given of a fabrication method for the first embodiment. As shown in FIG. 4, for example, the p-type semiconductor substrate 101 is prepared. Then, as shown in FIG. 5, the gate insulating film 106 for the assist gate 107 is formed by thermal oxidization. Then, an electrode material 107a of the assist gate 107 is formed on the gate insulating film 106. For example, phosphor-doped amorphous silicon may be deposited by thermal CVD. Then, as shown in FIG. 6, the electrode material 107a is patterned by lithography and etched to form the assist gate 107. The resist that was used in this process remains. Next, as shown in FIG. 7, the high-concentration impurity region 109 is formed in the semiconductor substrate 101. An example of this process is implemented according to the following conditions. Ion-implantation (dopant: B (Boron), preferably, BF2, dope amount: 1e12-1e17 (atoms/cm2), preferably, 1e13-1e16, more preferably, 1e13-3e14, acceleration energy: 10 keV-200 keV, preferably, 10 keV-100 keV, more preferably, 10 keV-70 keV.

Figure 8:
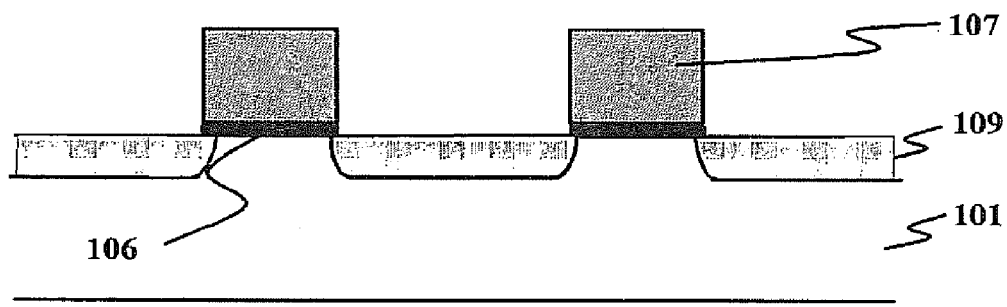
FIG. 8 is a view showing a (fifth) fabrication method for the first embodiment.
Figure 9:
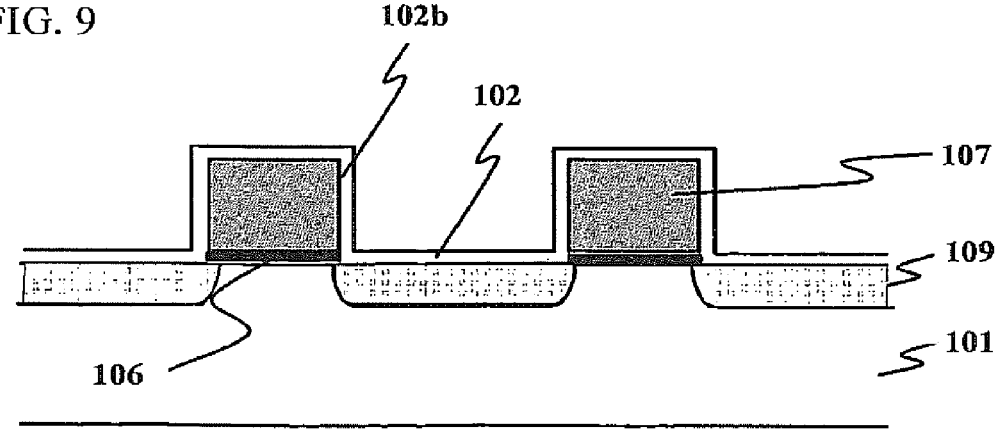
FIG. 9 is a view showing a (sixth) fabrication method for the first embodiment.
Figure 10:
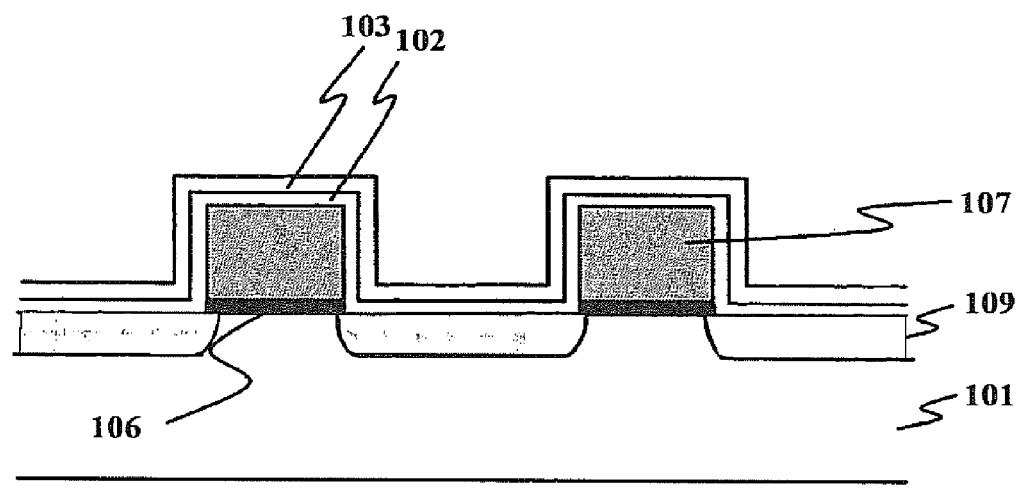
FIG. 10 is a view showing a (seventh) fabrication method for the first embodiment.
Figure 11:
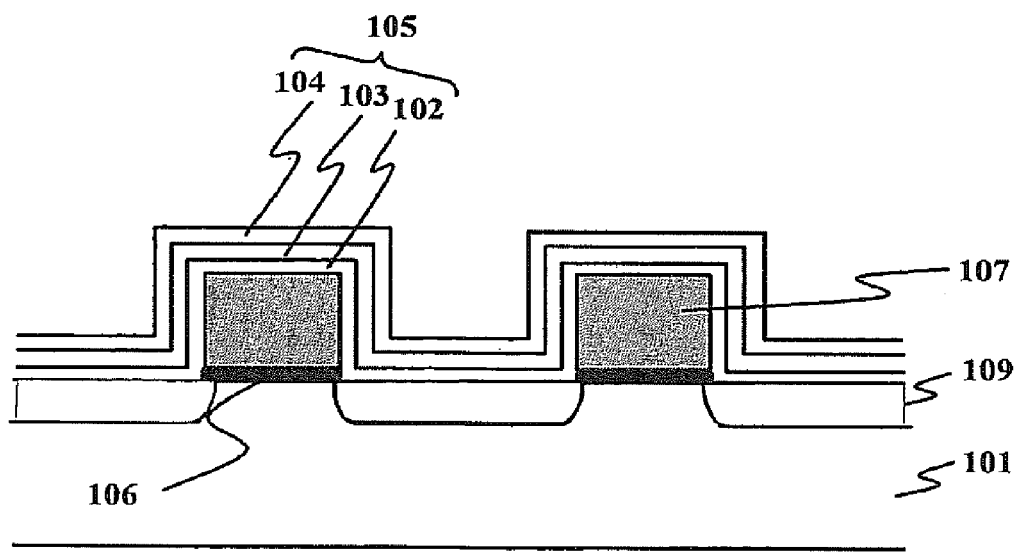
FIG. 11 is a view showing a (eighth) fabrication method for the first 15 embodiment.
Figure 12:
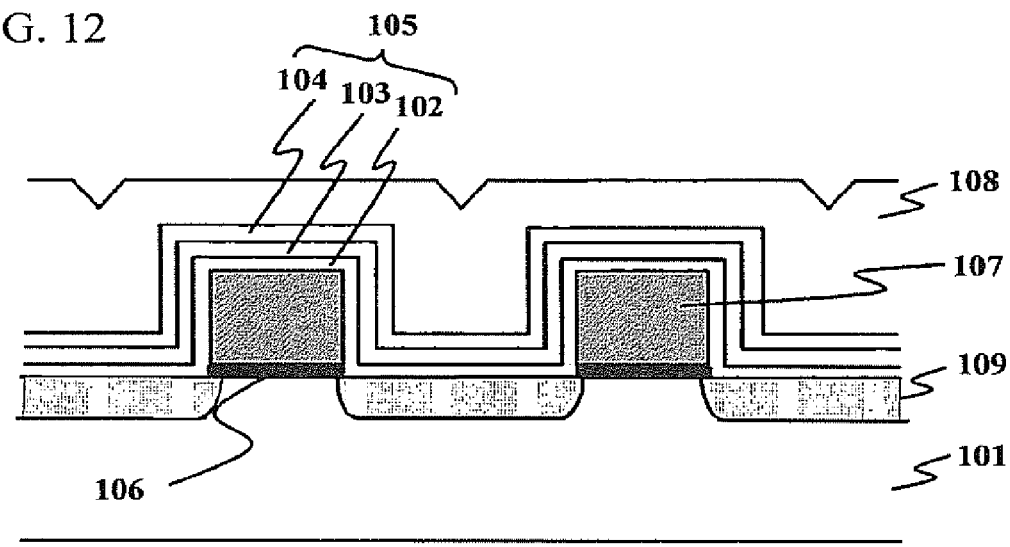
FIG. 12 is a view showing a (ninth) fabrication method for the first embodiment.

Next, as shown in FIG. 8, the resist is removed in the washing and cleaning process by using a solution of sulfuric acid and hydrogen peroxide. Then, as shown in FIG. 9, the tunnel oxide film 102 is formed. In this case, the periphery of the assist gate 107 is also oxidized to form an oxidized layer 102b. Next, as shown in FIG. 10, a nitride film ($Si_3N_4$) is deposited by thermal CVD to form the storage film 103. Then, as shown in FIG. 11, the top oxide film 104 is formed by forming the oxide film by thermal CVD. Lastly, as shown in FIG. 12, the word line 108 is laminated on the top oxide film 104. This process is performed by depositing undoped polysilicon by thermal CVD, an impurity such as As or P is injected into the polysilicon, and then the polysilicon is etched in the lateral direction by lithography and etching processes.

Second Embodiment

In regards to the next embodiment, there is provided the ONO structure in which the tunnel oxide film, the storage nitride film, and the top oxide film are sequentially laminated. This ONO structure is formed after the assist gate is formed, and there is not provided a sidewall on a side wall of the assist gate. In addition, the surface region of the semiconductor substrate is cut out in a U shape between the assist gates.

Figure 13:
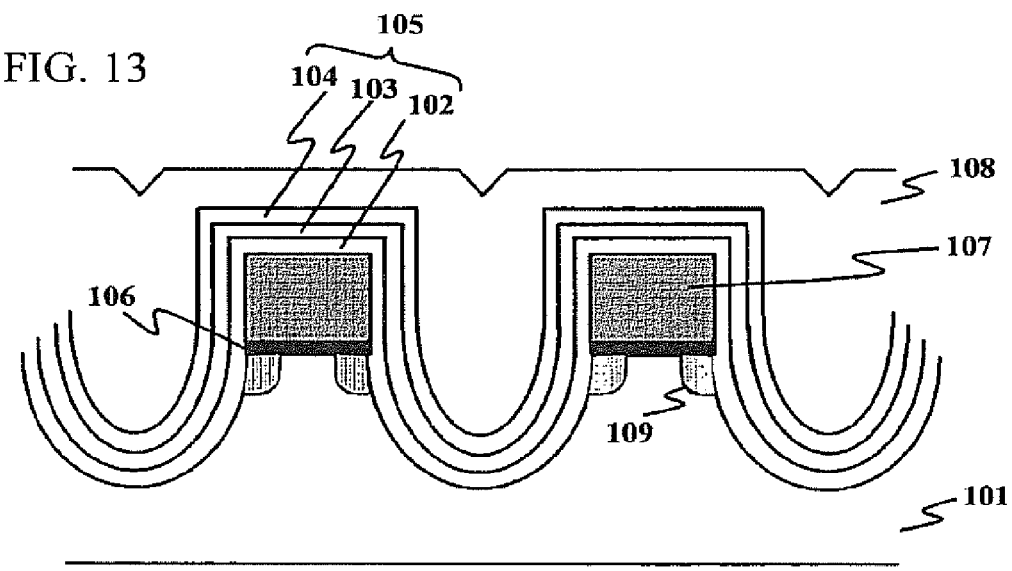
FIG. 13 is a cross-sectional view of a memory cell in accordance with a second embodiment of the present invention.

FIG. 13 is a cross-sectional view illustrating a memory cell in accordance with a second embodiment of the present invention. In this figure, the same components and configurations as those of FIG. 2 have the same reference numerals. Also in the second embodiment, both the tunnel film 102 and the top film 104 are configured to be the oxide films having thicknesses equal to or greater than 4 nm, which is equal to the thickness of the FN tunneling region.

In the second embodiment, there is provided the U-shaped cutout between the assist gates adjacently arranged to each other in the surface region of the semiconductor substrate. The aforementioned U-shaped cutout, namely a substantially U-shaped recess can be processed by known photolithography techniques and dry etching techniques, as will be described later.

This U-shaped recess provided on the surface of the semiconductor substrate 101 makes the channel longer than that of the first embodiment. Therefore, even if the resistance to short-channel effects becomes high and the memory cell array is to be reduced, there are device characteristics the operation margin is allowed.

Figure 14:
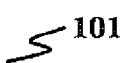
FIG. 14 is a view showing a (first) fabrication method for the second embodiment.
Figure 15:
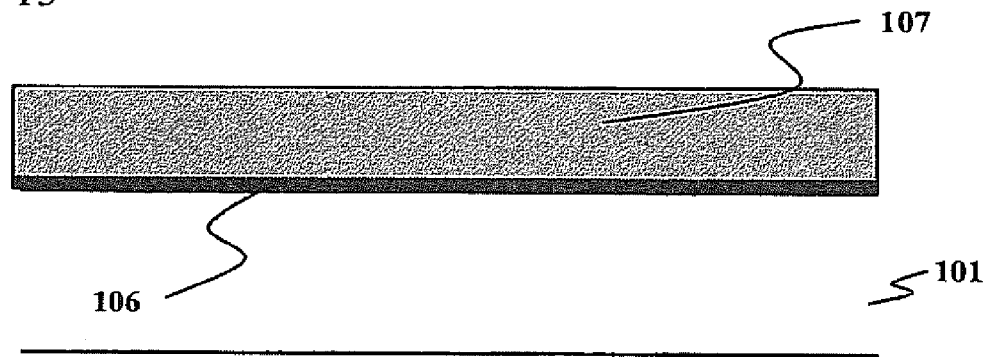
FIG. 15 is a view showing a (second) fabrication method for the second embodiment.
Figure 16:
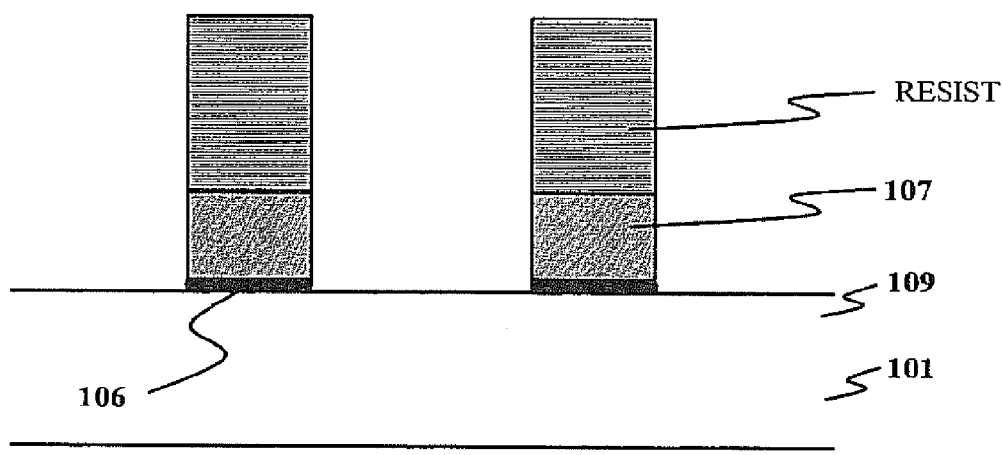
FIG. 16 is a view showing a (third) fabrication method for the second embodiment.
Figure 17:
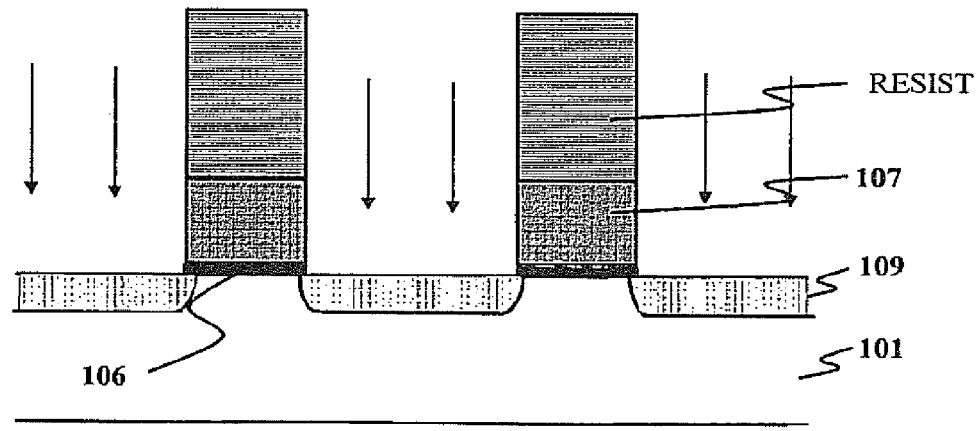
FIG. 17 is a view showing a (fourth) fabrication method for the second embodiment.

As shown in FIG. 14, the p-type semiconductor substrate 101 is prepared. Then, as shown in FIG. 15, the gate insulating film 106 for the assist gate 107 is formed by thermal oxidization. Then, the electrode material 107a of the assist gate 107 is formed on the gate insulating film 106. For example, phosphor (P)-doped amorphous silicon is deposited by thermal CVD. Then, as shown in FIG. 16, the electrode material 107a is patterned by lithography—and etching to form the assist gate 107. The resist that was used in this process remains. Next, as shown in FIG. 17, the high-concentration impurity region 109 is formed in the semiconductor substrate 101. An example of this process is implemented according to the following conditions. Ion-implantation (dopant: B (Boron), preferably, BF2, dope amount: 1e12-1e17 (atoms/cm2), preferably, 1e13-1e16, more preferably, 1e13-3e14, acceleration energy: 10 keV-200 keV, preferably, 10 keV-100 keV, more preferably, 10 keV-70 keV.

Figure 18:
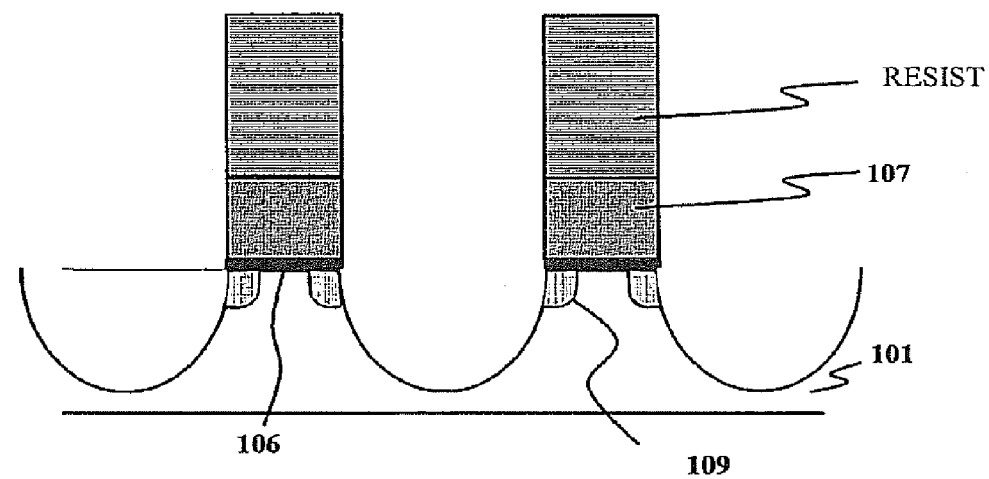
FIG. 18 is a view showing a (fifth) fabrication method for the second embodiment.
Figure 19:
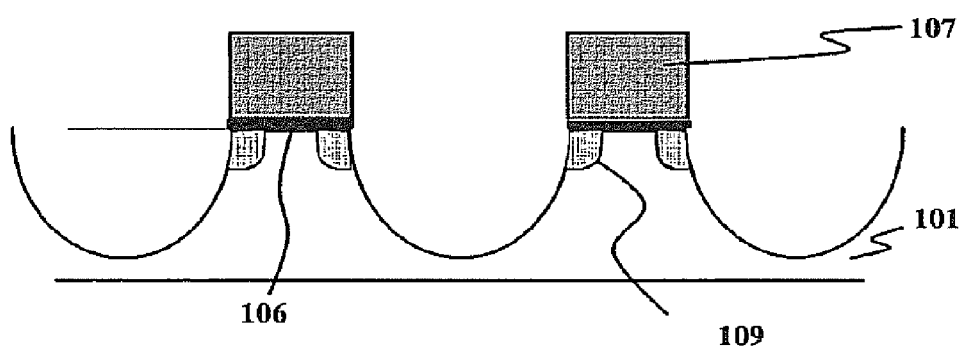
FIG. 19 is a view showing a (sixth) fabrication method for the second embodiment.
Figure 20:
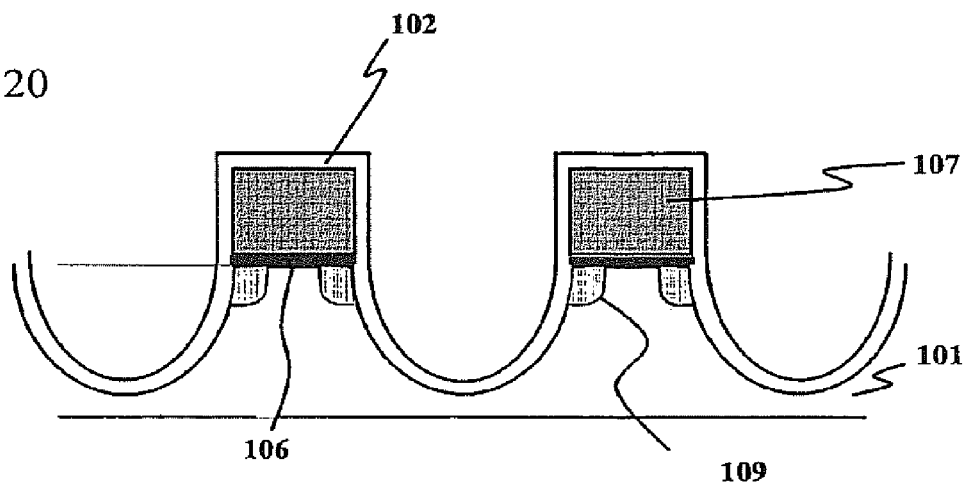
FIG. 20 is a view showing a (seventh) fabrication method for the second embodiment.

Next, as shown in FIG. 18, a U-shaped recess 121 is formed in the semiconductor substrate 101. Then, as shown in FIG. 19, the resist is removed in the washing and cleaning process by using a solution of sulfuric acid and hydrogen peroxide. Then, as shown in FIG. 20, the tunnel oxide film 102 is laminated on the whole surface of the semiconductor substrate 101 by thermal or plasma oxidization. The tunnel oxide film 102 has to be formed inside the U-shaped recess 121, and accordingly, it is desirable that the tunnel oxide film 102 should be formed uniformly in a method that is less dependent on the plane orientation of the substrate crystal. It is desirable that thermal oxidization should be employed for the plane substrate in view of the quality of the film. However, the dependency on the plane orientation is large inside a recess having the above-mentioned curvature, resulting in the problem of uneven film thickness. Therefore, it is desirable that plasma oxidization should be used. The plasma oxidization is known as an oxidizing method that is in no way inferior to thermal oxidization in view of the quality of film and that has little dependency on the plane orientation. The plasma oxidization denotes that a gas including an oxygen gas is formed into plasma with the use of microwaves or RF, and the wafer surface is exposed to the plasma to be oxidized directly. In particular, a noble gas may be added to enhance the plasma density. He, Ne, or Ar is often used as the noble gas, and, in addition, it is more desirable that Kr or Xe should be used to lower the temperature of the electrons. Further, the surface wave plasma excited by the microwaves is preferable, because low irradiation energy can be realized in a high density equal to or more than 1e12/cm3 and low ion irradiation energy equal to or lower than 7e. Moreover, it is further preferable that a radial line slot antenna should be employed in view of the evenness on the wafer surface.

Figure 21:
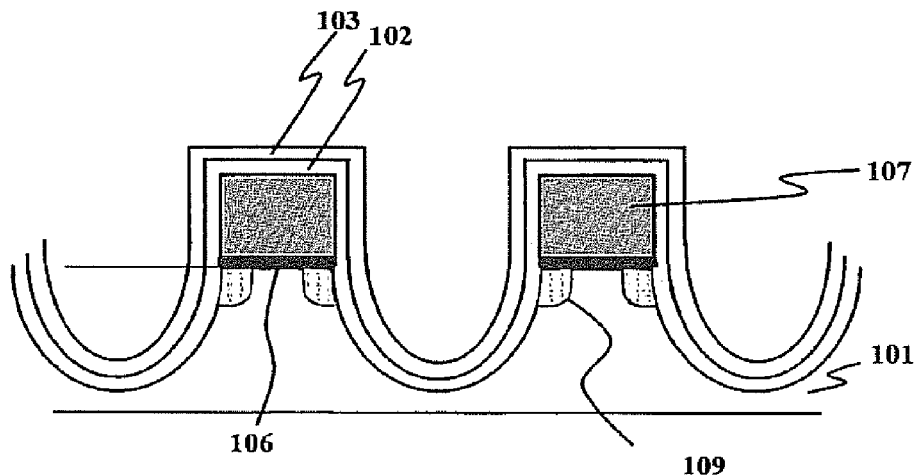
FIG. 21 is a view showing a (eighth) fabrication method for the second 35 embodiment.

Then, as shown in FIG. 21, a nitride film is deposited to a thickness of 10 nm by thermal CVD to form the storage film 103.

Third Embodiment

In the next embodiment (the third embodiment), there is provided the ONO structure in which the tunnel oxide film, the storage nitride film, and the top oxide film are sequentially laminated. This ONO structure is formed before the assist gate is formed, and there is not provided a sidewall on a side wall of the assist gate.

Figure 22:
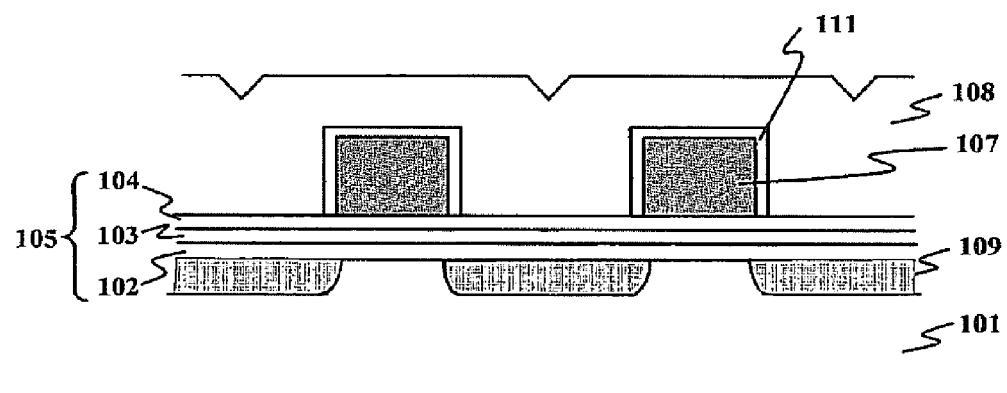
FIG. 22 is a cross-sectional view of a memory cell in accordance with a third embodiment of the present invention.

FIG. 22 is a cross-sectional view illustrating a memory cell in accordance with a third embodiment of the present invention. In this figure, the same components and configurations as those of FIG. 2 have the same reference numerals. The assist gate 107 is formed on the ONO structure 105, which is formed on the surface of the semiconductor substrate 101. A reference numeral 111 shown in this figure is an insulating film formed on the top and side walls of the assist gate 107.

In this configuration, the tunnel oxide film 102 included in the ONO structure 105 also serves as a gate insulating film of the assist gate 107. Here, both the tunnel film 102 and the top film 104 are configured to be the oxide films having thicknesses equal to or greater than 4 nm of the FN tunneling region.

In the third embodiment, the tunnel film 102 in the ONO structure 105 also serves as the gate insulating film of the assist gate 107, leading to simplification of the fabrication process. In addition, the charge can be stored below the assist gate 107 and the window of the threshold value becomes wide, leading to device operation having a margin.

Figure 23:
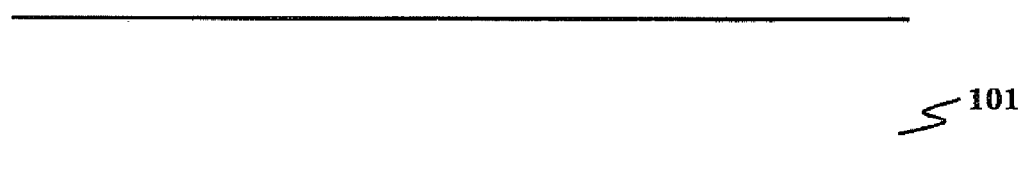
FIG. 23 is a view showing a (first) fabrication method for the third embodiment.
Figure 24:
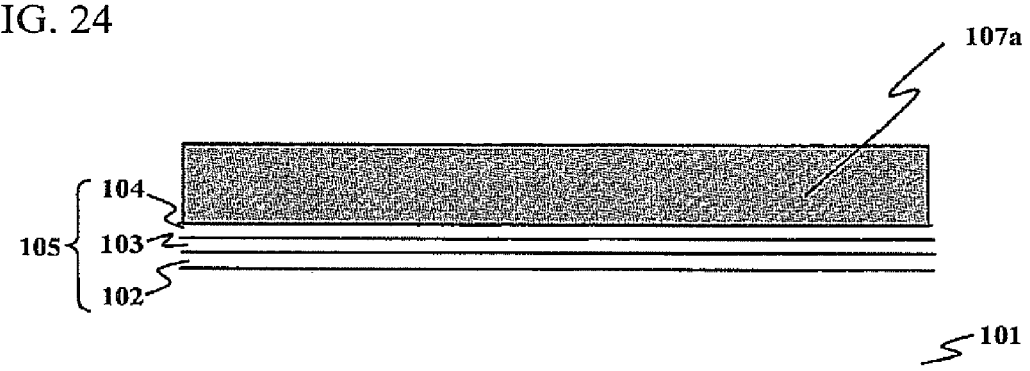
FIG. 24 is a view showing a (second) fabrication method for the third embodiment.

Next, a description will be given of the fabrication process in accordance with the third embodiment. Then, as shown in FIG. 23, firstly, the p-type semiconductor substrate 101 is prepared. Then, as shown in FIG. 24, an ONO film 102-104 is formed. For example, the tunnel oxidization film 102 is formed by thermal oxidization, and then nitride film is deposited to a thickness of 10 nm by thermal CVD to form the storage film 103. Lastly, the silicon oxide film ($SiO_2$) is deposited by thermal CVD to form the top oxide film 104. Instead of the aforementioned method, the tunnel oxide film 102 is formed by thermal oxidization, and then the nitride film is deposited to a thickness of 15 nm by thermal CVD for form the storage film 103. Lastly, the top oxide film 104 may be formed by thermal CVD to form the storage film 103. Lastly, the top oxide film 104 may be formed by thermal oxidization (wet oxidization) or plasma oxidization. After the ONO film 102-104 is formed in this manner, the electrode material 107a of phosphor-doped amorphous silicon is deposited.

Figure 25:
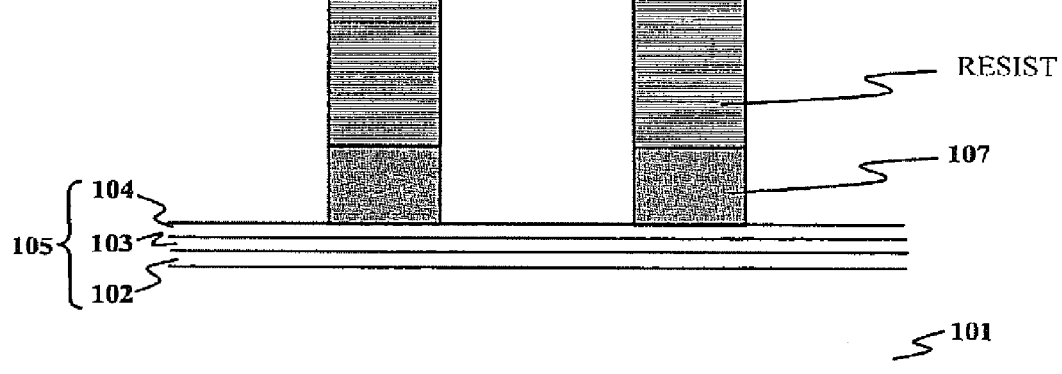
FIG. 25 is a view showing a (third) fabrication method for the third embodiment.
Figure 26:
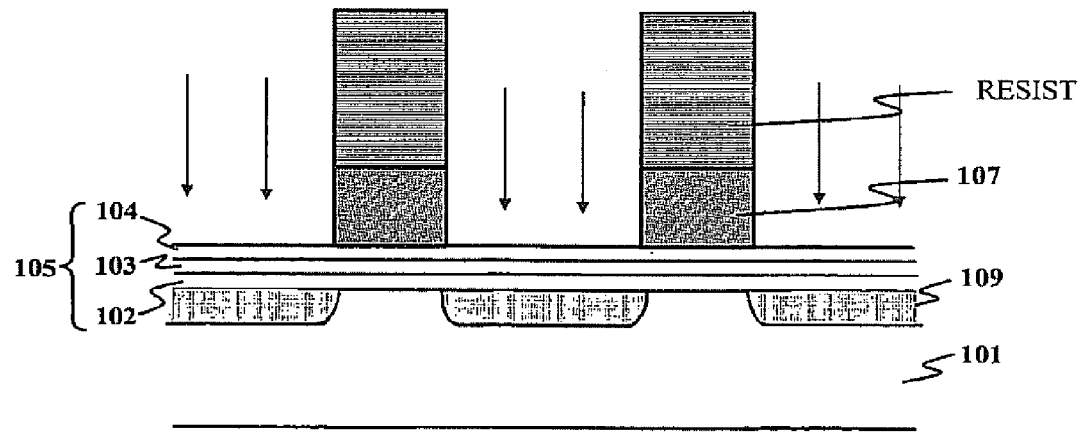
FIG. 26 is a view showing a (fourth) fabrication method for the third embodiment.
Figure 27:
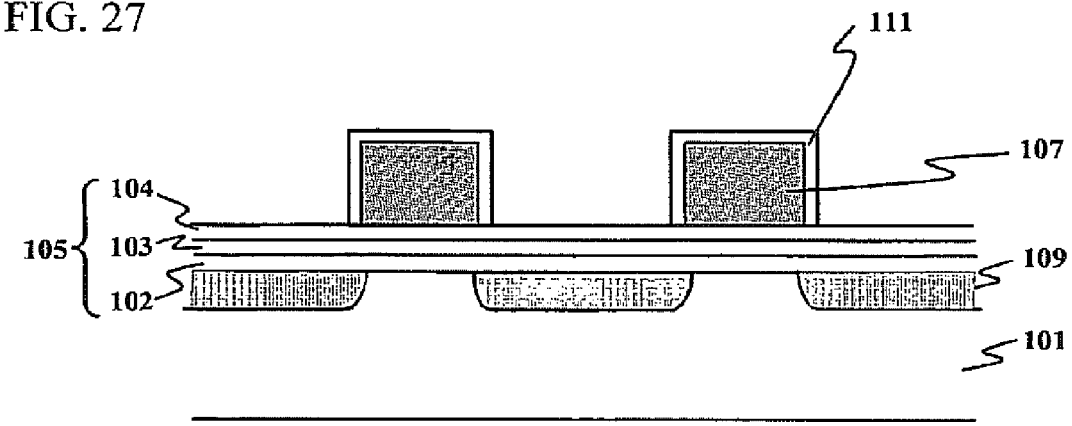
FIG. 27 is a view showing a (fifth) fabrication method for the third 10 embodiment.
Figure 28:
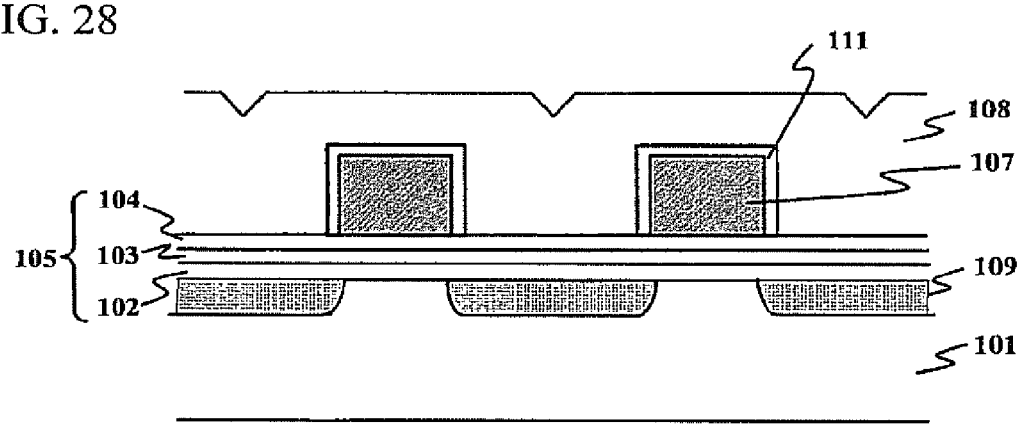
FIG. 28 is a view showing a (sixth) fabrication method for the third embodiment.

Then, as shown in FIG. 25, the electrode material 107a is patterned with the use of lithography and etching to form the assist gate 107. Next, as shown in FIG. 26, the high-concentration impurity region 109 is formed in the semiconductor substrate 101. An example of ion-implantation in this process is shown as follows. Dopant: B (Boron), preferably, BF2, dope amount: 1e12-1e17 (atoms/cm2), preferably 1e13-1e16, more preferably, 1e13-3e14, acceleration energy: 10 keV-200 keV, preferably, 10 keV-100 keV, more preferably, 10 keV-70 keV. Next, as shown in FIG. 27, the insulating film 111 is formed in the periphery of the assist gate 107 by thermal oxidization. Lastly, the word line 108 is formed on the top oxide film 104. In this process, an undoped polysilicon is deposited by the thermal CVD, for example, and then an impurity such as As or P is injected into the polysilicon, and the polysilicon is etched in the lateral direction by the lithography and etching processes.

Fourth Embodiment

In regards to the next embodiment, the tunnel oxide film and the storage nitride film are deposited after the assist gate is formed. Also, the sidewalls are provided on the side walls of the assist gate.

Figure 29:
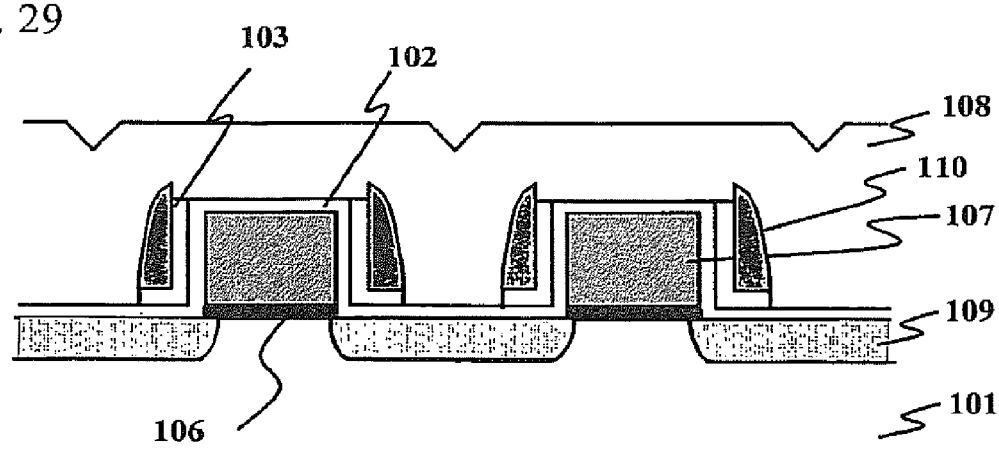
FIG. 29 is a view showing the principle of operation in accordance with a fourth embodiment of the present invention.

FIG. 29 is a cross-sectional view illustrating a memory cell in accordance with a fourth embodiment of the present invention. In this figure, the same components and configurations as those of FIG. 2 have the same reference numerals. Sidewalls 110 are provided as side walls of the assist gate 107. Here, as previously described, the tunnel oxide film 102 is configured to be equal to or greater than 4 nm for the FN tunneling region. The charge storage region of the fourth embodiment is composed of the tunnel oxide film 102 and the storage film 103.

In the present embodiment, the sidewalls 110 are provided on side walls of the assist gate 107, and at least the storage film (nitride film) 103 and the ONO structure 105 is not provided between the sidewalls 110.

In the fourth embodiment, the storage film 103 is not provided above the assist gate 107, and, accordingly, the charge is programmed into the center of the channel. Therefore, the difficulty of erasing and the increase in CBD (Complementary Bit Disturb) can be advantageously reduced.

Figure 30:
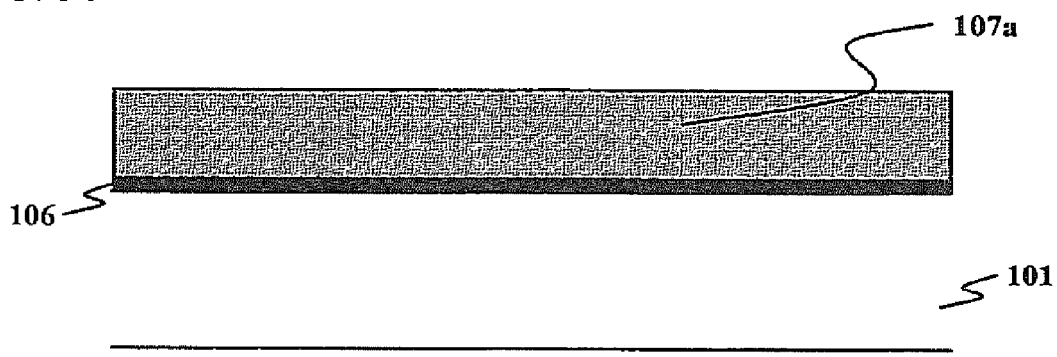
FIG. 30 is a view showing a (first) fabrication method for the fourth embodiment.
Figure 31:
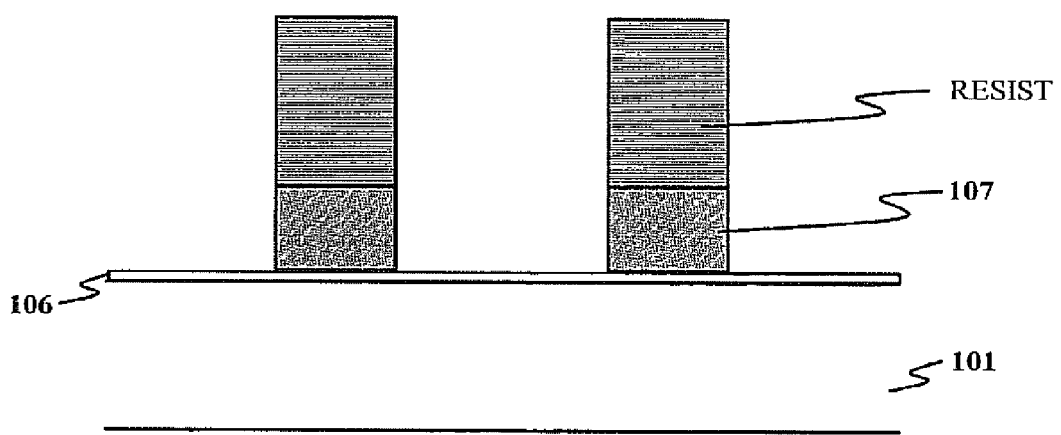
FIG. 31 is a view showing a (second) fabrication method for the fourth embodiment.
Figure 32:
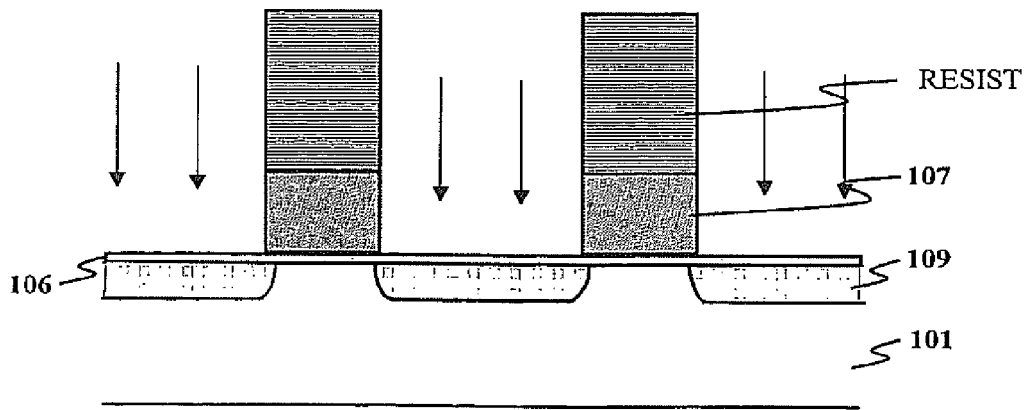
FIG. 32 is a view showing a (third) fabrication method for the fourth embodiment.
Figure 33:
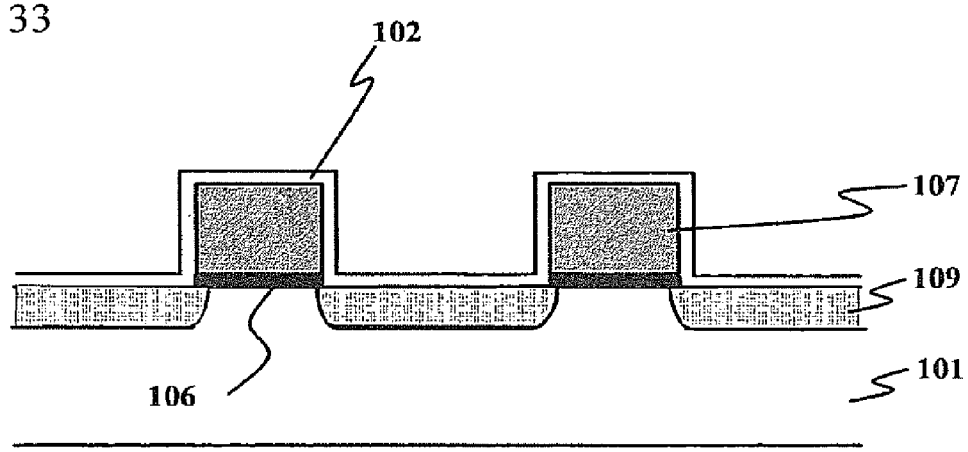
FIG. 33 is a view showing a (fourth) fabrication method for the fourth embodiment.
Figure 34:
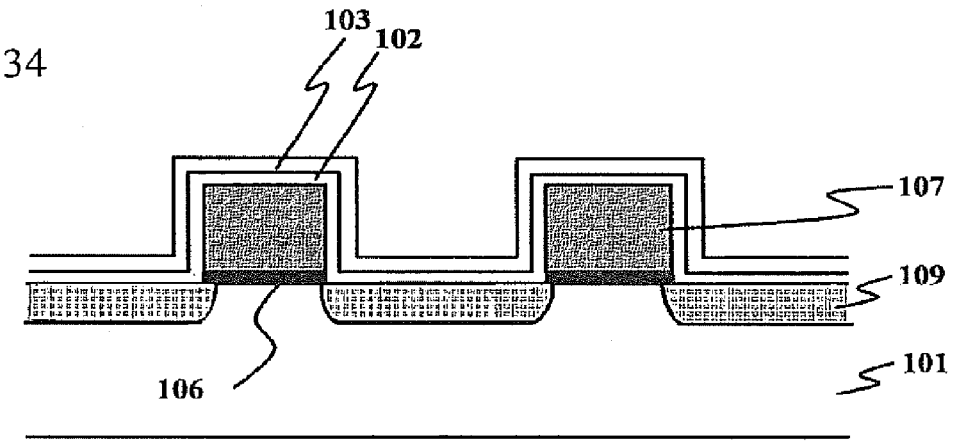
FIG. 34 is a view showing a (fifth) fabrication method for the fourth embodiment.

Next, a description will be given of the fabrication method of the fourth embodiment. First, as shown in FIG. 30, the gate insulating film 106 is formed on the p-type semiconductor substrate 101 by thermal oxidization, and the electrode material 107a is deposited thereon by thermal CVD. Then, as shown in FIG. 31, the assist gate 107 is formed. Next, as shown in FIG. 32, the high-concentration impurity region 109 is formed in the semiconductor substrate 101. An example of the ion-implantation condition has been described above. Then, as shown in FIG. 33, after the resist is stripped in the washing and cleaning processes by using a solution of sulfuric acid and hydrogen peroxide, the tunnel oxide film 102 is formed. In this case, the gate insulating film 106 provided between the assist gates 107 is removed in the preprocessing (hydrofluoric acid) and, subsequently, the semiconductor substrate 101 and the periphery of the assist gates 107 are thermally oxidized. Then, as shown in FIG. 34, the nitride film is deposited to a thickness of 10 nm by thermal CVD to form the storage film 103.

Figure 35:
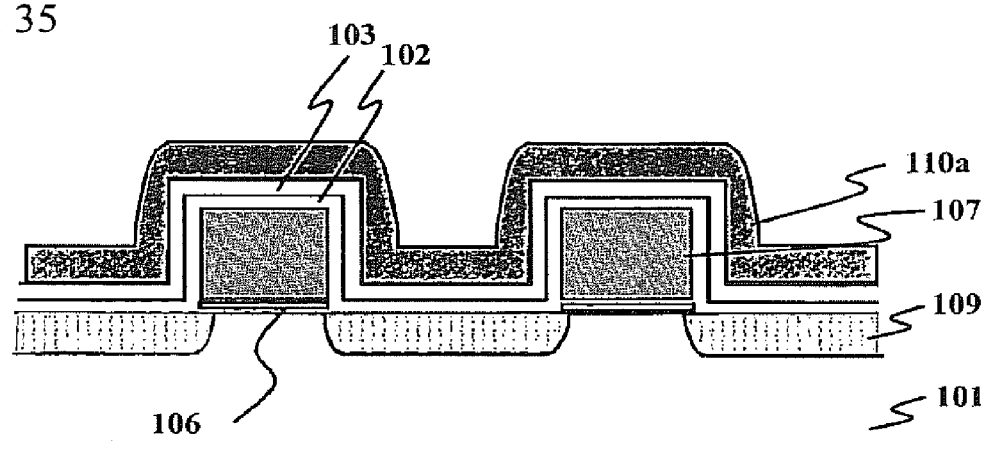
FIG. 35 is a view showing a (sixth) fabrication method for the fourth embodiment.
Figure 36:
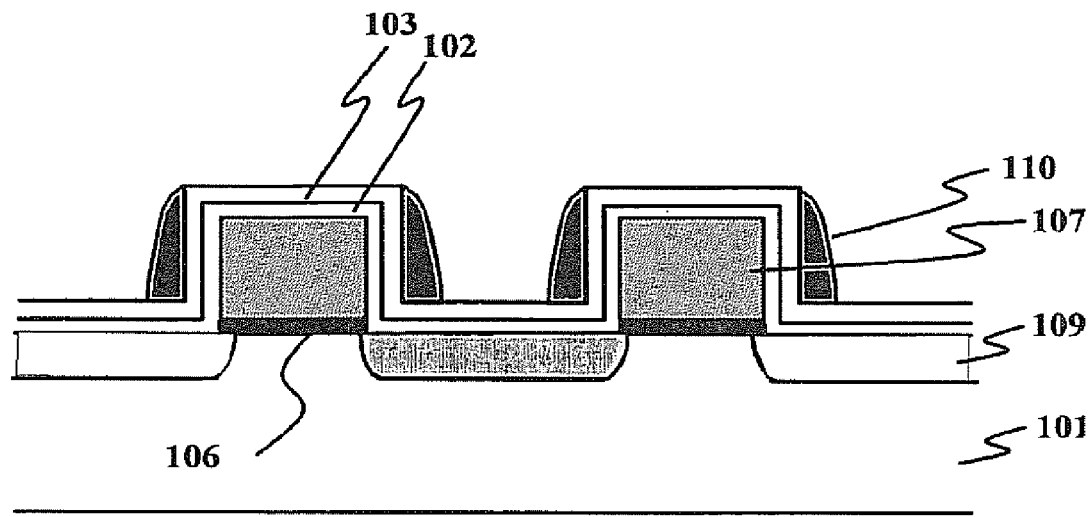
FIG. 36 is a view showing a (seventh) fabrication method for the fourth embodiment.
Figure 37:
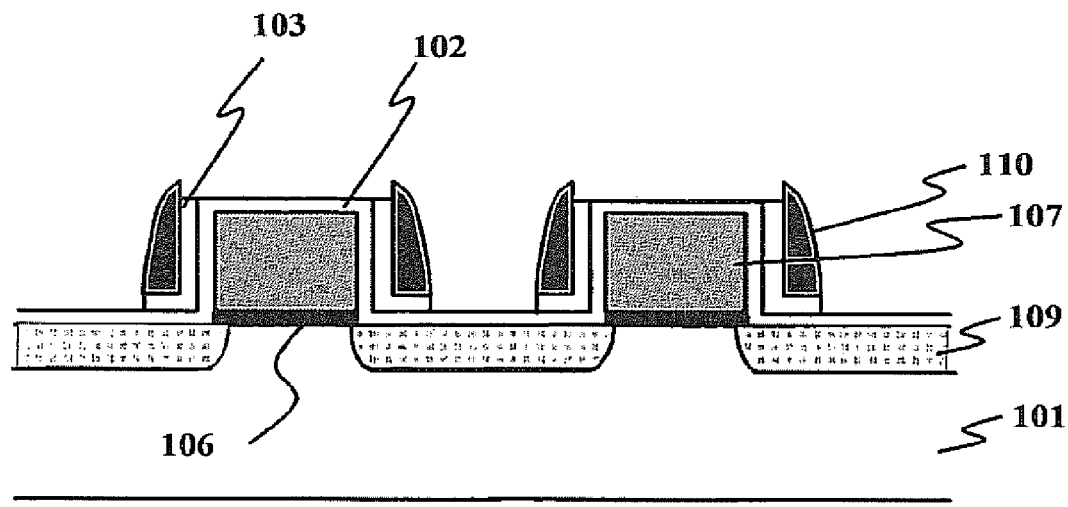
FIG. 37 is a view showing a (eighth) fabrication method for the fourth embodiment.
Figure 38:
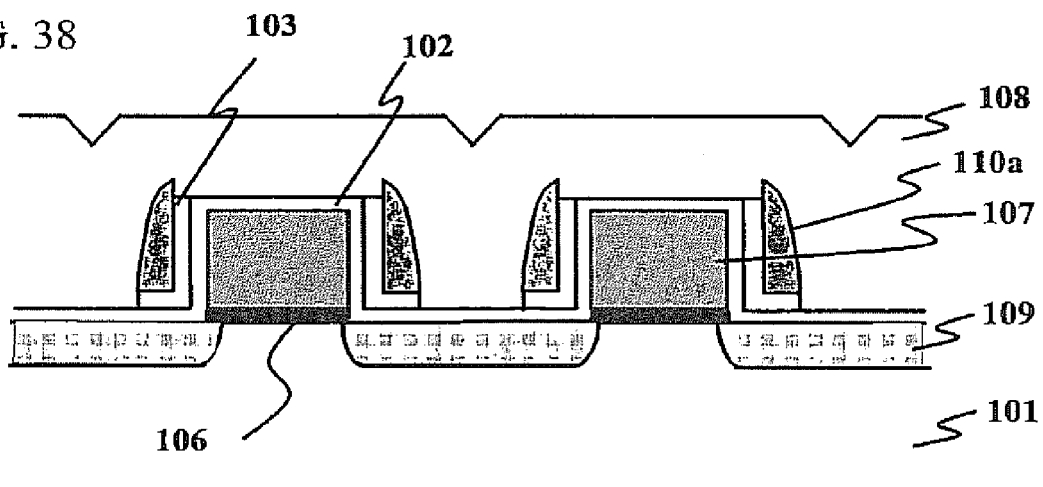
FIG. 38 is a view showing a (ninth) fabrication method for the fourth embodiment.

Next, as shown in FIG. 35, a sidewall material 10a such as $SiO_2$ is deposited by thermal CVD. As shown in FIG. 36, $SiO_2$ is etched back and stopped at the storage film 103 to form the sidewall 110. Then, as shown in FIG. 37, the nitride film between the sidewalls is removed by etching. In this case, the nitride film provided above the assist gate 107 is also removed. Lastly, as shown in FIG. 38, the word line 108 is formed.

Fifth Embodiment

In regards to the next embodiment, there is provided the ONO structure in which the tunnel oxide film, the storage nitride film, and the top oxide film are sequentially laminated. This ONO structure is formed before the assist gate is formed, and there are provided sidewalls on side walls of the assist gate.

Figure 39:
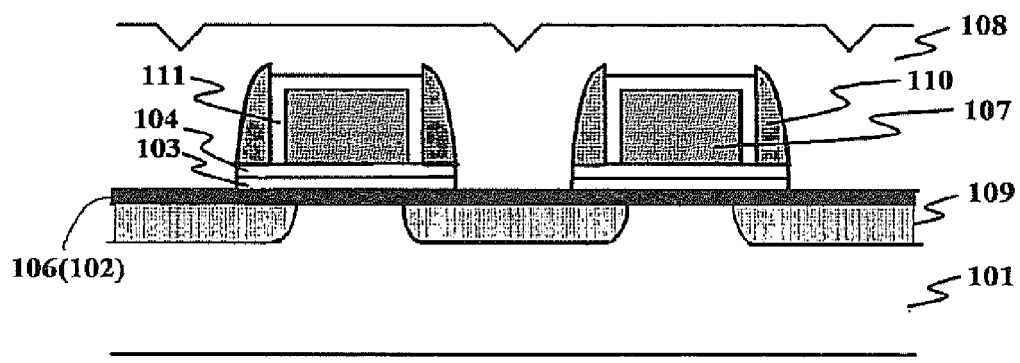
FIG. 39 is a cross-sectional view of a memory cell in accordance with a fifth embodiment of the present invention.

FIG. 39 is a cross-sectional view illustrating a memory cell in accordance with a fifth embodiment of the present invention. In this figure, the same components and configurations as those of FIG. 5 have the same reference numerals. Here, as described, both the tunnel oxide film 102 and the top film 104 are configured to be an oxide film equal to or greater than 4 nm for FN tunneling regions.

In this embodiment, as in the fourth embodiment, the sidewalls 110 are formed on the side walls of the assist gate 107, and at least the storage film (nitride film) 103 in the ONO structure 105 is not provided between the sidewalls 110. Accordingly, the charge is programmed into the center of the channel. Therefore, the difficulty in erasing and the increase in CBD (Complementary Bit Disturb) can be reduced. In addition, there are other characteristics that can simplify the fabrication process, as in the third embodiment.

Figure 40:
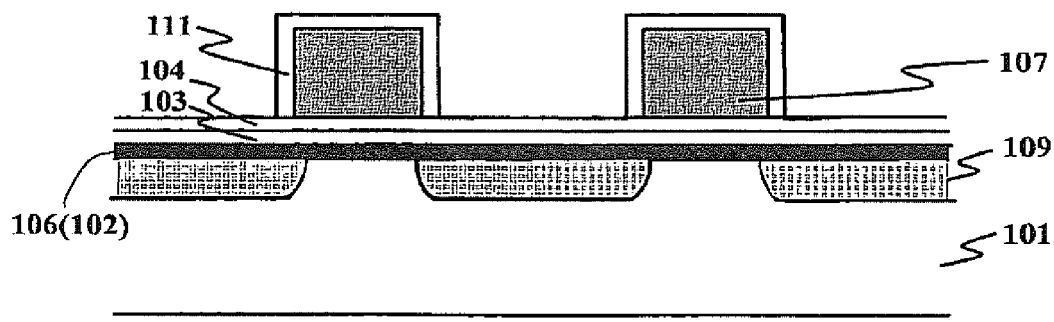
FIG. 40 is a view showing a (first) fabrication method for the fifth embodiment.
Figure 41:
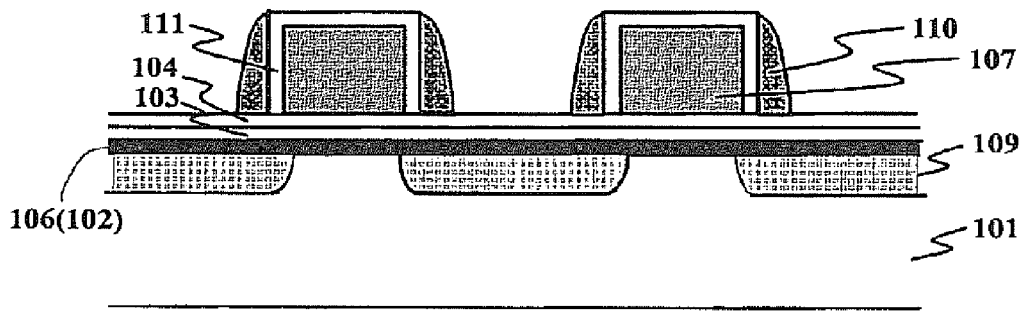
FIG. 41 is a view showing a (second) fabrication method for the fifth embodiment.
Figure 42:
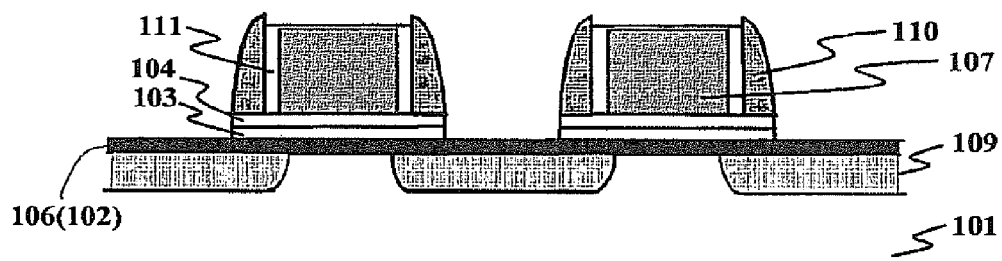
FIG. 42 is a view showing a (third) fabrication method for the fifth embodiment.
Figure 43:
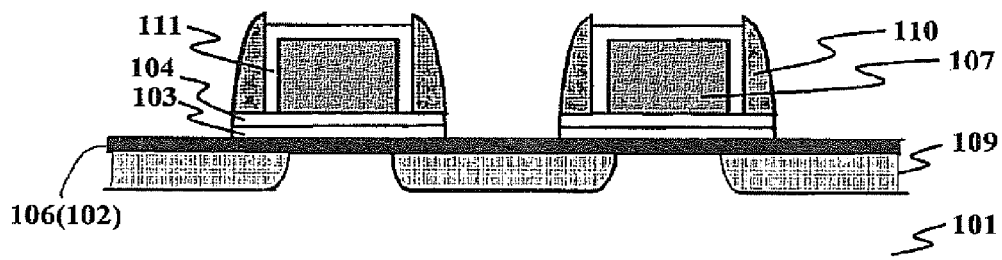
FIG. 43 is a view showing a (fourth) fabrication method for the fifth embodiment.
Figure 44:
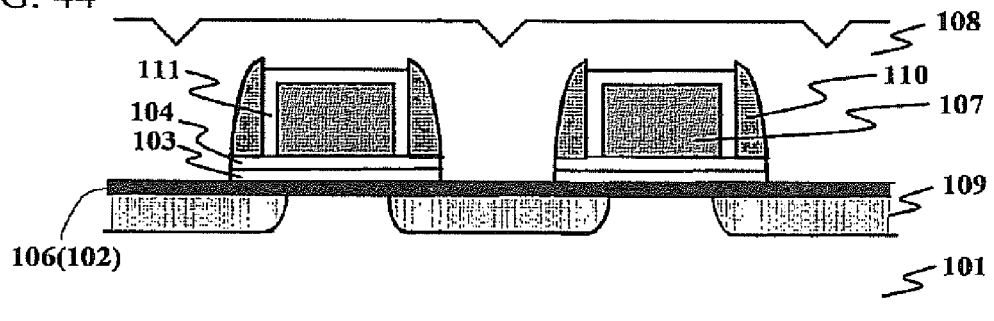
FIG. 44 is a view showing a (fifth) fabrication method for the fifth embodiment.

Next, a description will be given of a fabrication method of the fifth embodiment. After passing the steps in FIGS. 23 through 27, the structure shown in FIG. 40 is formed. Then, as shown in FIG. 41, the sidewalls 110 are formed. This process is the same as those shown in FIGS. 35 and 37. The sidewalls 110 are made of nitride film ($Si_3N_4$). Then, as shown in FIG. 42, the top film 104 and the storage film 103 are etched with the use of the sidewalls 110 as masks. In this case, the insulating film (oxide film) provided on the assist gate 107 is removed. Next, as shown in FIG. 43, the insulating film is formed again on the assist gate 107 by the thermal oxidization. Lastly, the word line 108 is formed as shown in FIG. 44.

As described, in accordance with the present invention, it is possible to provide the memory technique of a SONOS type non-volatile memory, which enables high data retention characteristics and simplicity in data erasing. A semiconductor device in accordance with the present invention includes, for example, a semiconductor memory device, and a semiconductor device including the aforementioned memory as a part thereof such as system LSI.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating a semiconductor device comprising the steps of:
    forming assist gates on a gate insulating film on a semiconductor substrate of a chosen conductivity type;
    forming a high-concentration impurity region in the semiconductor substrate and located predominantly between adjacent assist gates, the high-concentration impurity region having the same conductivity type as that of the semiconductor substrate, wherein portions of the high-concentration impurity region underlie the adjacent assist gates; and
    forming a charge storage region above the semiconductor substrate and composed of at least a tunnel oxide film and a storage film.

2. The method as claimed in claim 1, wherein the tunnel oxide film is formed with a thickness equal to or greater than 4 nm.

3. The method as claimed in claim 1, wherein the tunnel oxide film is formed with a thickness equal to or greater than 5 nm.

4. The method as claimed in claim 1, wherein the tunnel oxide film is formed with a thickness equal to or greater than 6 nm.

5. The method as claimed in claim 1, wherein the tunnel oxide film is formed with a thickness equal to or greater than 7 nm.

6. The method as claimed in claim 1, wherein the tunnel oxide film is formed with a thickness equal to or greater than 10 nm.

7. The method as claimed in claim 1, further comprising a step of forming a top oxide film on the storage film, and wherein at least one of the tunnel oxide film and the top oxide film have a thickness equal to or greater than 5 nm.

8. The method as claimed in claim 1, further comprising a step of forming a top oxide film on the storage film, and wherein at least one of the tunnel oxide film and the top oxide film have a thickness equal to or greater than 6 nm.

9. The method as claimed in claim 1, further comprising a step of forming a top oxide film on the storage film, and wherein at least one of the tunnel oxide film and the top oxide film have a thickness equal to or greater than 7 nm.

10. The method as claimed in claim 1, further comprising a step of forming a top oxide film on the storage film, and wherein at least one of the tunnel oxide film and the top oxide film have a thickness equal to or greater than 10 nm.

11. The method as claimed in claim 1, wherein the tunnel oxide film has a thickness in which TN tunneling is dominant.

12. The method as claimed in claim 1, further comprising a step of forming a substantially U-shaped recess in the semiconductor substrate and located between adjacent assist gates.

13. The method as claimed in claim 1, further comprising forming sidewalls along sides of the assist gates.

14. The method as claimed in claim 13, wherein the sidewalls are formed as part of the charge storage region, wherein the charge storage region is formed along the sides of the assist gates.

15. The method as claimed in claim 1, wherein the charge storage region is formed below the assist gates.

16. The method as claimed in claim 1, wherein the step of forming the charge storage region includes forming a gate insulating film below the assist gates.

17. The method as claimed in claim 1, wherein the charge storage region is formed so as to cover the assist gates.

* * * * *